US012666838B2

(12) United States Patent
Kim et al.

(10) Patent No.: US 12,666,838 B2
(45) Date of Patent: Jun. 23, 2026

(54) LIGHT EMITTING DISPLAY DEVICE

(71) Applicant: LG Display Co., Ltd., Seoul (KR)

(72) Inventors: Ho-Jin Kim, Paju-si (KR); Seung-Min Baik, Paju-si (KR); Hyeong-Jun Lim, Paju-si (KR); Bong-Choon Kwak, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 406 days.

(21) Appl. No.: 18/521,844

(22) Filed: Nov. 28, 2023

(65) Prior Publication Data

US 2024/0224688 A1 Jul. 4, 2024

(30) Foreign Application Priority Data

Dec. 29, 2022 (KR) ........................ 10-2022-0188261

(51) Int. Cl.
*H10K 59/35* (2023.01)
*H10K 59/80* (2023.01)

(52) U.S. Cl.
CPC ......... *H10K 59/353* (2023.02); *H10K 59/876* (2023.02)

(58) Field of Classification Search
CPC ........................... H10K 59/121; H10K 59/122
See application file for complete search history.

(56) References Cited

U.S. PATENT DOCUMENTS 10,388,913 B2 8/2019 Jung et al.
10,651,428 B2 5/2020 Jung et al.

2016/0071910 A1 3/2016 Sasaki et al.
2019/0035862 A1* 1/2019 Koshihara ............ H10K 59/123
2019/0165061 A1 5/2019 Jung et al.
2019/0355935 A1 11/2019 Jung et al.
2020/0044177 A1 2/2020 Kim et al.
2020/0266390 A1 8/2020 Jung et al.

FOREIGN PATENT DOCUMENTS

JP 2016-057488 A 4/2016
JP 2019-117941 A 7/2019
KR 10-2019-0062678 A 6/2019
KR 10-2022-0036556 A 3/2022

OTHER PUBLICATIONS

Japan Patent Office, Office Action, Japanese Patent Application No. 2023-211867, Dec. 10, 2024, 10 pages.

* cited by examiner

*Primary Examiner* — Evren Seven
(74) *Attorney, Agent, or Firm* — Fenwick & West LLP

(57) ABSTRACT

A display device includes a trench, which includes: first and second trench lines respectively located between neighboring column lines and between neighboring row lines, wherein the first trench line includes a first side groove in a column direction, and first and second corner grooves connected between adjacent first side grooves, forming an isosceles portion protruding to one side in a row direction, having second and first diagonal directions, respectively, and connected to each other at a first contact point, wherein the second trench line includes a second side groove in the row direction, and the first and second corner grooves connected between adjacent second side grooves, forming an isosceles portion protruding to one side in the column direction, and connected to each other at a second contact point, wherein the protruding isosceles portions of the first and second trench lines share the first corner groove.

26 Claims, 5 Drawing Sheets

SPc    VS    SPa

SPc  =  SPa
NEAc  >  NEAa
EAc  <  EAa

LIGHT EMITTING DISPLAY DEVICE

CROSS REFERENCE TO RELATED APPLICATION

The present application claims the priority benefit of Republic of Korea Patent Application No. 10-2022-0188261 filed in Republic of Korea on Dec. 29, 2022, which is hereby incorporated by reference in its entirety.

BACKGROUND

Field of Technology

The present disclosure relates to a light emitting display device.

Discussion of the Related Art

Recently, flat panel display devices having excellent characteristics such as thinness, light weight, and low power consumption have been widely developed and applied to various fields.

Among the flat panel display devices, a light emitting display device uses a light emitting element in which charges are injected into a light emitting layer formed between a cathode as an electron injection electrode and an anode as a hole injection electrode so that electrons and holes pair up and then annihilate to emit light.

In such the light emitting display device, the light emitting layer is formed on the entire surface of the substrate through a deposition process without a separate mask.

In this case, adjacent subpixels are electrically connected through the light emitting layer, allowing leakage current to flow to the adjacent subpixels. The possibility of occurrence of such the leakage current increases as display devices become higher resolution. When the leakage current occurs, image quality of the display device deteriorates.

SUMMARY

Accordingly, the present invention is directed to a light emitting display device that substantially obviates one or more of the problems due to limitations and disadvantages of the related art.

An advantage of the present disclosure is to provide a light emitting display device which can prevent or at least reduce leakage current between adjacent subpixels.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present disclosure, as embodied and broadly described herein, a light emitting display device comprises: a substrate; a plurality of subpixels arranged in a matrix form along a plurality of row lines and a plurality of column lines on the substrate; a plurality of first electrodes, each first electrode on a subpixel from the plurality of subpixels; a bank that covers an edge of the plurality of first electrodes, the bank including a trench along a boundary between neighboring subpixels from the plurality of subpixels; a plurality of light emitting layers, each light emitting layer located on a corresponding first electrode from the plurality of first electrodes, and the plurality of light emitting layers separated from each other by the trench; and a second electrode on the plurality of light emitting layers, wherein the plurality of subpixels include a first subpixel and a second subpixel adjacent to each other in a row direction, and a fourth subpixel and a third subpixel that are respectively adjacent to the first subpixel and the second subpixel in a column direction, and each of the first subpixel, the second subpixel, the third subpixel, and the fourth subpixel includes a quadrangular protruding corner portion and three inclined corner portions, wherein the trench includes: a first corner groove that extends in a second diagonal direction and is at a boundary between a protruding corner portion of the first subpixel in a first diagonal direction of the first subpixel and an inclined corner portion of the third subpixel that is adjacent to the protruding corner portion of the first subpixel; second corner grooves in a first diagonal direction and are at a boundary between the protruding corner portion of the first subpixel and an inclined corner portion of the second subpixel and at a boundary between the protruding corner portion of the first subpixel and an inclined corner portion of the fourth subpixel, the second corner grooves connected to the first corner groove at a first contact point and a second contact point; a first side groove in the column direction and at a boundary between the first subpixel and the second subpixel and at boundary between the third subpixel and the fourth subpixel; and a second side groove in the row direction and at a boundary between the second subpixel and the third subpixel and at a boundary between the first subpixel and the fourth subpixel, wherein the second side groove at the boundary between the second subpixel and the third subpixel is connected to the first contact point, and the first side groove at the boundary between the third subpixel and the fourth subpixel is connected to the second contact point.

In one embodiment, a light emitting display device includes: a substrate; a plurality of subpixels arranged in a matrix form along a plurality of row lines and a plurality of column lines on the substrate; a plurality of first electrodes, each first electrode on a subpixel from the plurality of subpixels; a bank that covers an edge of the plurality of first electrodes, the bank including a trench along a boundary between neighboring subpixels from the plurality of subpixels; a plurality of light emitting layers, each light emitting layer located on a corresponding first electrode from the plurality of first electrodes, and the plurality of light emitting layers separated from each other by the trench; and a second electrode on the plurality of light emitting layers, wherein the trench includes: a first trench line along a boundary between neighboring column lines of subpixels from the plurality of column lines; and a second trench line along a boundary between neighboring row lines of subpixels from the plurality of row lines, wherein the first trench line includes first side grooves in a column direction, and a first corner groove and a second corner groove that are connected between the first side grooves, the first corner groove and the second corner groove forming a first isosceles portion of the first trench line that protrudes in a row direction, the first corner groove extending in a second diagonal direction and the second corner groove extending in a first diagonal direction, and the first corner groove and the second corner groove connected to each other at a first contact point, wherein the second trench line includes second side grooves in the row direction, and the first corner groove and another second corner groove are connected between the second side grooves, the first corner groove and the other second corner groove forming a second isosceles portion that protrudes in the column direction, the first corner groove and the other second corner groove connected to each other at a second contact point, wherein the first isosceles portion of the first trench line and the second isosceles portion of the second trench line both include the first corner groove.

In one embodiment, a light emitting display device, comprises: a substrate; a plurality of subpixels arranged in a plurality of row lines and a plurality of column lines, each subpixel including a first area having a plurality of chamfered corners and a second area having a protrusion that extends from the first area in a first diagonal direction away from the first area in a plan view of the light emitting display device; a plurality of light emitting elements, each light emitting element in the first area of a corresponding subpixel of the plurality of subpixels; a plurality of transistors, each transistor in the second area of a corresponding subpixel of the plurality of subpixels and electrically connected to the light emitting element in the first area of the corresponding subpixel; and a trench between the plurality of subpixels and surrounding a perimeter of each of the plurality of subpixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
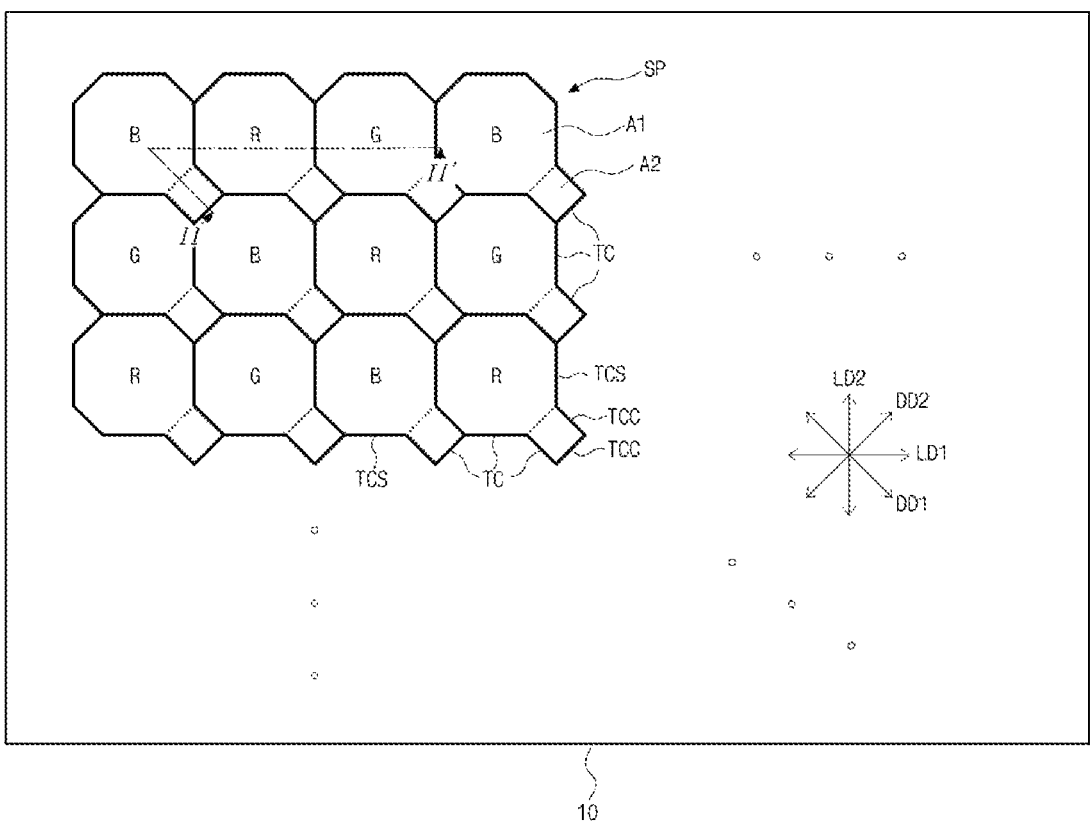
FIG. 1 is a plan view schematically illustrating a light emitting display device according to a first embodiment of the present disclosure.

Advantages and features of the present invention and methods of achieving them will be apparent with reference to the embodiments described below in detail with the accompanying drawings. However, the present invention is not limited to the embodiments disclosed below, but can be realized in a variety of different forms, and only these embodiments allow the present invention to be complete.

The present invention is provided to fully inform the scope of the invention to the skilled in the art of the present invention, and the present invention can be defined by the scope of the claims.

The shapes, sizes, proportions, angles, numbers, and the like disclosed in the drawings for explaining the embodiments of the present invention are illustrative, and the present invention is not limited to the illustrated matters. The same reference numerals refer to the same components throughout the description.

Furthermore, in describing the present invention, if it is determined that a detailed description of the related known technology unnecessarily obscure the subject matter of the present invention, the detailed description thereof can be omitted. When 'comprising', 'including', and 'having', and the like are used in this invention, other parts can be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on', 'over', 'above', 'below', 'beside', 'under', and the like, one or more other parts can be positioned between such two parts unless 'right' or 'directly' is used.

In the case of a description of a temporal relationship, for example, when a temporal precedence is described as 'after', 'following', 'before', and the like, cases that are not continuous can be included unless 'directly' or 'immediately' is used.

In describing components of the present invention, terms such as first, second and the like can be used. These terms are only for distinguishing the components from other components, and an essence, order, order, or number of the components is not limited by the terms. Further, when it is described that a component is "connected", "coupled" or "contact" to another component, the component can be directly connected or contact the another component, but it should be understood that other component can be "interposed" between the components.

Respective features of various embodiments of the present invention can be partially or wholly connected to or combined with each other and can be technically interlocked and driven variously, and respective embodiments can be independently implemented from each other or can be implemented together with a related relationship.

Hereinafter, embodiments of the present invention are described in detail with reference to the drawings. Meanwhile, in the following embodiments, the same and like reference numerals are assigned to the same and like components, and detailed descriptions thereof may be omitted.

First Embodiment

Figure 2:
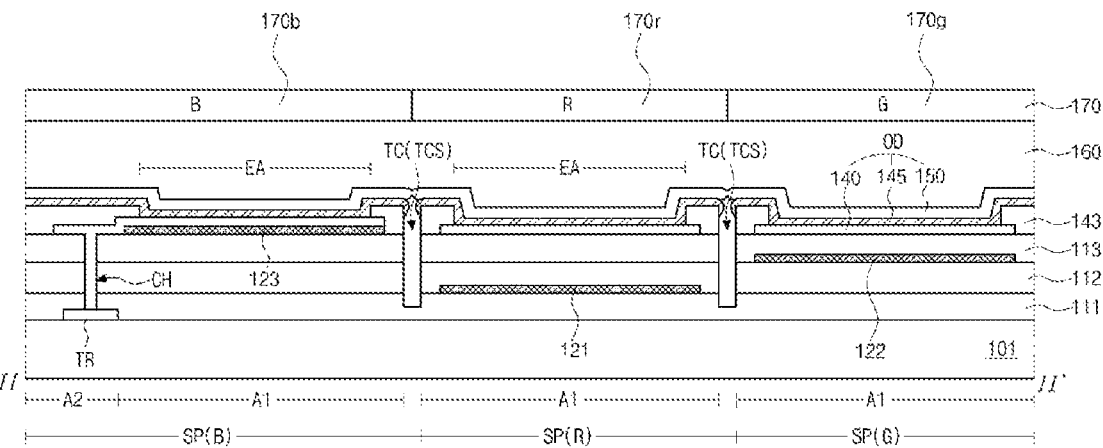
FIG. 2 is a cross-sectional view taken along a line II-II' of FIG. 1 according to one embodiment.

FIG. 1 is a plan view schematically illustrating a light emitting display device according to a first embodiment of the present disclosure. FIG. 2 is a cross-sectional view taken along a line II-II' of FIG. 1 and schematically shows a cross-sectional structure of subpixels according to one embodiment.

Prior to detailed description, for convenience of explanation, a direction in which a row line extends in FIG. 1 is referred to as a row direction (or horizontal direction) LD1, and a direction in which a column line that intersects (or is perpendicular to) the row direction LD1 extends in FIG. 1 is referred to as a column direction (vertical direction) LD2. And, regarding two diagonal directions between the row direction LD1 and the column direction LD2, a direction toward upper left and lower right is referred to as a first diagonal direction DD1, and a direction toward lower left and upper right is referred to as a second diagonal direction DD2.

Referring to FIGS. 1 and 2, the light emitting display device 10 according to this embodiment may include a display region for displaying an image, in which a plurality of subpixels SP may be arranged in a matrix form along a plurality of row lines and column lines.

The plurality of subpixels SP may include subpixels that constitute a unit pixel and display first, second and third colors as different colors, for example, red (R), green (G), and blue (B) subpixels respectively displaying red, green, and blue. As another example, the plurality of subpixels SP may further include a subpixel displaying white.

In this embodiment, for convenience of explanation, a case in which R, G, and B subpixels SP are arranged is taken as an example.

Such the subpixel SP may include a light emitting diode OD as a light emitting element, and a plurality of thin film transistors TR and at least one storage capacitor as driving element for driving the light emitting diode OD.

Each subpixel SP may include a first region A1 where the light emitting diode OD is disposed, and a second region A2 where the light emitting diode OD and the thin film transistor TR are connected to each other. In one embodiment, the first region A1 is a first area having a plurality of chamfered corners and the second region A2 is a second area that extends from the first region A1 in a diagonal direction (e.g., DD1) away from the first region A1 in a plan view of the light emitting display device as shown in FIG. 1.

A configuration of the subpixel SP is explained with further reference to FIG. 2.

Referring to FIG. 2, the light emitting display device 10 of this embodiment may be a top emission type display device. That is, it may be configured such that light is emitted toward a top of the substrate 101. Alternatively, the light emitting display device 10 of this embodiment may be a bottom emission type display device.

The substrate 101 may use an insulating substrate such as a glass substrate or a plastic substrate. As another example, the substrate may use a silicon substrate (or silicon wafer) made of single crystalline silicon that functions as a semiconductor, and in this case, there is an advantage of effectively implementing a small-sized display device that requires high resolution.

In this embodiment, for convenience of explanation, a case where an insulating substrate is used is taken as an example.

The plurality of thin film transistors TR may be formed in each subpixel SP on the substrate 101. Meanwhile, in this embodiment, for convenience of explanation, one thin film transistor TR connected to the light emitting diode OD in the subpixel SP is shown. Meanwhile, the thin film transistor TR in FIG. 2 may be a driving thin film transistor, but is not limited thereto.

Meanwhile, although not specifically shown, the thin film transistor TR may include a semiconductor layer, a gate insulating layer, a gate electrode, a source electrode, and a drain electrode. Here, as the thin film transistor TR, a thin film transistor with a so-called bottom gate structure in which the gate electrode is located below the semiconductor layer, or a thin film transistor with a so-called top gate structure in which the gate electrode is located above the semiconductor layer may be used.

Meanwhile, in a case where a semiconductor substrate is used as the substrate 101, an active region functioning as a semiconductor layer may be formed inside the semiconductor substrate.

At least one insulating layer may be formed on the thin film transistor TR. In this embodiment, for convenience of explanation, an example is taken where three insulating layers i.e., first to third insulating layers 111 to 113 are formed.

The first insulating layer 111 may be formed substantially on the entire surface of the substrate 101 while covering the thin film transistor TR. The first insulating layer 111 may be made of an organic insulating material or an inorganic insulating material.

On the first insulating layer 111, a first reflector 121 may be formed within the R subpixel SP.

The second insulating layer 112 may be formed the first insulating layer 111 on which the first reflector 121 is formed and substantially over the entire surface of the substrate 101. The second insulating layer 112 may be made of an organic insulating material or an inorganic insulating material.

On the second insulating layer 112, a second reflector 122 may be formed within the G subpixel SP.

The third insulating layer 113 may be formed on the second insulating layer 112 on which the second reflector 122 is formed and substantially over the entire surface of the substrate 101. The third insulating layer 113 may be made of an organic insulating material or an inorganic insulating material.

On the third insulating layer 113, a third reflector 123 may be formed within the B subpixel SP.

Meanwhile, a contact hole CH exposing one electrode, for example, a drain electrode, of the thin film transistor TR may be formed in the first to third insulating layers 111 to 113.

In addition, the first to third reflectors 121 to 123 may be made of at least one of various metal materials with reflective properties, such as aluminum Al, silver Ag, titanium Ti, and APC (Al—Pd—Cu) alloy, but not limited thereto.

The first to third reflectors 121 to 123 may each function to reflect light, which is generated from the light emitting diode OD located there above in the corresponding subpixel SP and travels downward, to an upward direction.

In this regard, the first to third reflectors 121 to 123 may be formed to correspond to the first regions A1 of the corresponding subpixels SP. For example, the first to third reflectors 121 to 123 may be formed to correspond to emission regions EA in the first regions A1 of the corresponding subpixels SP without extending to the second region A2.

On the substrate 101 on which the third reflector 123 is formed, first electrode 140 of the light emitting diode OD may be formed for each subpixel SP. The first electrode 140 may be formed in a patterned form for each subpixel SP.

Here, the first electrode 140 may be formed in both the first region A1 and the second region A2 of each subpixel SP.

The first electrode 140 may be formed of a transparent conductive material such as ITO, IZO, ITZO, or the like.

The first electrode 140 formed in each of the R subpixel SP(R) and the G subpixel SP(G) may be formed on the third insulating layer 113. The first electrode 140 formed in the B subpixel SP(B) may be formed on the third reflector 123 of this subpixel SP(B). As another example, an additional insulating layer may be formed on the third reflector 123 and substantially over the entire surface of the substrate, and the first electrode 140 may be formed for each subpixel SP on the additional insulating layer.

The first electrode 140 formed in each subpixel SP may be connected to the drain electrode of the thin film transistor TR of the corresponding subpixel SP through the contact hole CH. As another example, at least one conductive connection pattern (or metal pattern) may be located between the first electrode 140 and the thin film transistor TR to electrically connect the first electrode 140 and the thin film transistor TR. In this regard, for example, a connection pattern, which is formed at the same layer as and of the same material as at least one of the first to third reflectors 121 to 123, may be provided, the first electrode 140 and the thin film transistors TR may be connected through the connection pattern.

A bank (or partition) 143 surrounding each subpixel SP may be formed on the first electrode 140 along an edge of each subpixel SP. The bank 143 may be made of an inorganic insulating material or an organic insulating material.

The bank 143 may be configured to have an opening that exposes the first electrode 140 of each subpixel SP and to cover the edge of the first electrode 140. Due to the opening of the bank 143, the emission region EA in which light is substantially generated within the subpixel SP may be defined within the first region A1.

In addition, the bank 143 may be formed to cover the second region A2 of each subpixel SP.

As such, a portion of the subpixel SP where the bank 143 is located may substantially be a non-emission region.

Meanwhile, in the light emitting display device 10 of this embodiment, a trench TC may be formed in the bank 143. The trench TC may be formed to surround each subpixel SP along a boundary of the subpixel SP to partition the subpixels SP.

In other words, the trench TC may be formed at the boundary between neighboring subpixels SP to physically divide the subpixels SP from each other.

Moreover, the trench TC may extend through an insulating layer located below the bank 143. For example, the trench TC may be formed through at least one insulating layer including the third insulating layer 113 among the first to third insulating layers 111 to 113. In this embodiment, a case where the trench TC is formed through the first to third insulating layers 111 to 113 is taken as an example.

A light emitting layer 145 may be formed on the bank 143 and on the first electrode 140 exposed through the opening of the bank 143. The light emitting layer 145 may be, for example, an organic light emitting layer formed using an organic material. Further, the light emitting layer 145 may be formed as a multi-layer structure including an emitting material layer.

The light emitting layer 145 may be separated (or disconnected or divided) in a unit of each subpixel SP by the trench TC surrounding each subpixel SP and be formed in a pattern corresponding to each subpixel SP. Here, the light emitting layer 145 may have a single-layer stack structure or a multi-layer stack structure. When the light emitting layer 145 has a single-layer stack structure, it may be completely separated into subpixels SP by the trench TC. When the light emitting layer 145 has a multi-layer stack structure, for example, a two-layer stack structure of a first stack as a lower stack and a second stack as an upper stack, the first stack and a charge generation layer between the first stack and second stacks may be completely separated by the trench TC, and a lower part of the second stack may be partially separated or the entire second stack may not be separated.

In this regard, for example, a light emitting material for forming the light emitting layer 145 may be deposited substantially on the entire display region of the substrate 101 through a deposition process. In this case, the light emitting material may not be deposited in the trench TC, but may be deposited in a form surrounding an inner surface of the trench TC.

Accordingly, the light emitting material may have a disconnected form in the trench TC, so that the light emitting layers 145 may be separated from each other by the trench TC and be formed in a pattern in each subpixel SP, and the light emitting layer 145 may be formed throughout each subpixel SP. Although not specifically shown, the light emitting material may remain in a form of sediment on a bottom of the trench TC.

Meanwhile, since the light emitting layer 145 may be formed substantially along the inner surface of the trench TC on a side of the corresponding subpixel SP, a separation distance between the neighboring light emitting layers 145 may substantially smaller than a width of the trench TC.

The light emitting layer 145 may be formed of, for example, a white light emitting layer that emits white light. Accordingly, all subpixels SP may emit the same white light.

As above, in this embodiment, the trench TC may be formed along the boundary of the subpixel SP, so that the light emitting layers 145 between the neighboring subpixels SP may be physically separated from each other. Accordingly, occurrence of leakage current through the light emitting layer 145 between the neighboring subpixels SP can be prevented or at least reduced.

The second electrode 150 may be formed on the light emitting layer 145 and substantially over the entire surface of the substrate 101.

In this regard, as mentioned above, the trench TC may exist at the boundary between the subpixels SP, but the separation distance between the light emitting layers 145 in the trench TC may be narrower than the width of the trench TC. Accordingly, the second electrode 150 can be formed without being disconnected in the trench TC, and as a result, the second electrode 150 can be formed continuously along all subpixels SP.

The second electrode 150 may be formed of a metal material having a transflective property, for example, magnesium (Mg), silver (Ag), or an alloy of magnesium (Mg) and silver (Ag).

As such, each subpixel SP may have the corresponding reflector 121, 122 or 123 and the second electrode 150 which are located on and below the light emitting layer 145 therebetween, so that a micro cavity structure can be implemented.

In this regard, the R subpixel SP(R), the G subpixel SP(G), and the B subpixel SP(B) emit lights of different colors i.e., different wavelengths, and thus have different cavity thicknesses (or different resonance distances) (i.e., different distances between the corresponding reflectors 121, 122 and 123 and the second electrode 150).

In this regard, the R, G, and B subpixels SP that display red, green, and blue each have a cavity thickness proportional to the corresponding color wavelength (or half wavelength), and the cavity thickness of each subpixel SP can be matched to an integer multiple of the half wavelength of the corresponding color.

In this regard, the R subpixel SP(R), which has the largest wavelength, can have the corresponding first cavity thickness by placing the first reflector 121 closest to the substrate. The G subpixel SP(G), which has the middle wavelength, can have the corresponding second cavity thickness by placing the second reflector 122 at a higher position than the first reflector 121. The B subpixel SP(B), which has the smallest wavelength, can have the corresponding third cavity thickness by placing the third reflector 123 at the highest position.

As such, by using the micro cavity structure, color purity and light efficiency can be improved.

Moreover, for the subpixels SP of different colors, the corresponding micro cavity thicknesses are realized by differentiating the positions of the corresponding reflectors 121, 122, and 123, so that the light emitting diodes OD of the subpixels SP may have substantially the same thickness and the light emitting diodes OD may have substantially the same characteristics.

On the second electrode 150, an encapsulation layer 160 that encapsulates the substrate 101 on which the second electrode 150 is formed may be formed over the entire surface of the substrate 101. The encapsulation layer 160 may serve to improve reliability by blocking penetration of moisture or oxygen from the outside.

Moreover, the encapsulation layer 160 may planarize the substrate 101 on which the second electrode 150 is formed.

This encapsulation layer 160 may be formed in a single-layer structure or a multi-layer structure using at least one of an inorganic insulating material and an organic insulating material.

A color filter layer 170 may be provided on the encapsulation layer 160 corresponding to each subpixel SP to implement a corresponding color.

In this regard, the color filter layer 170 may include R, G and B color filter patterns 170*r*, 170*g* and 170*b* corresponding R, G, and B subpixels SP for generating red, green, and blue.

Accordingly, the R, G, and B subpixels SP can display the corresponding colors with higher purity.

Meanwhile, although not specifically shown, a black matrix may be formed between neighboring color filter patterns on the encapsulation layer 160.

As described above, in the light emitting display device 10 of this embodiment, by forming the trench TC along the boundary of the subpixel SP, the light emitting layer 145 can be physically separated for each subpixel SP.

The trench TC needs to be formed to a certain width or less in order to separate a deposition material into each subpixel SP. For example, the trench TC is formed to have the width of approximately 200 nm or less.

The nanometer-sized fine trench TC may be formed through a mask process. The trench TC may be formed by exposure and etching through an exposure mask with a pattern corresponding to a shape of the trench TC.

Meanwhile, during the exposure process, the shape of the pattern is not transferred as it is due to effects such as diffraction, and thus the shape of the trench TC is deformed. To improve this, an optical proximity correction (OPC) design in which a deformation value in advance is calculated and the pattern is corrected is used.

In general, the subpixel SP is formed in a rectangular shape and is repeatedly arranged in the row and column directions. In this case, a cross-shaped trench is formed at a portion where four subpixels adjacent to each other in the row and column directions meet (or touch).

However, the cross-shaped trench has four corner portions with an intersection angle of 90 degrees, so that there is a limit to applying the OPC design. Thus, it is very difficult to realize the desired width.

Accordingly, in this embodiment, the subpixel SP and the trench TC formed along the boundary of the subpixel SP to define the shape of the subpixel SP are formed so that the OPC design can be applied.

Figure 3:
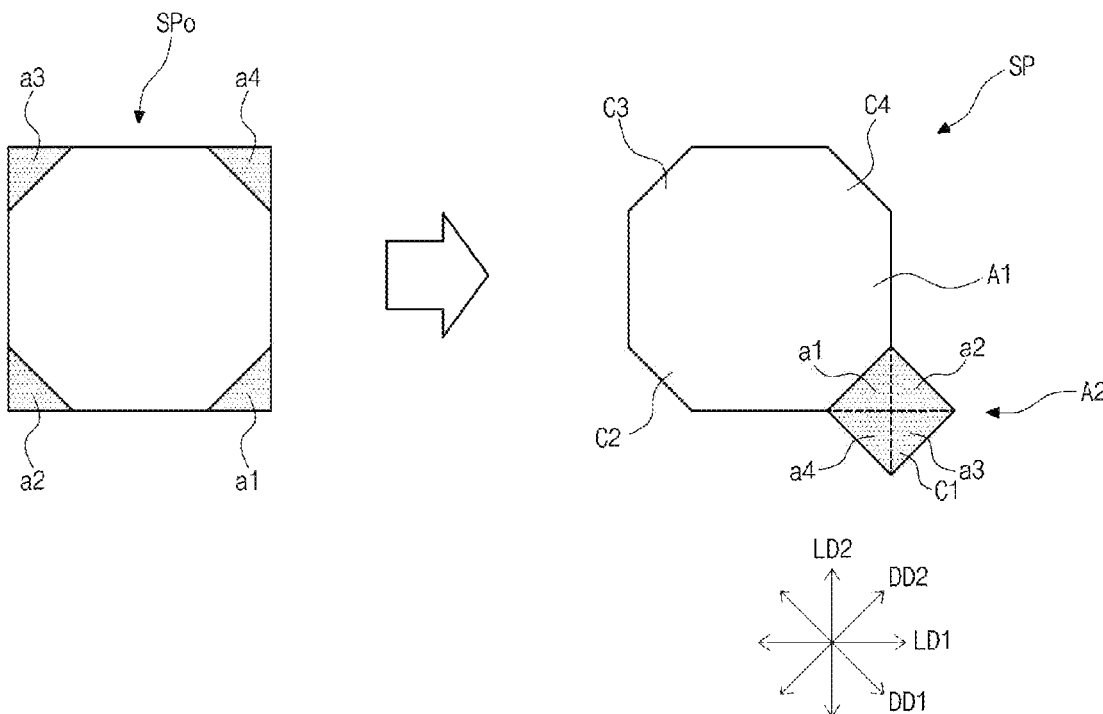
FIG. 3 is a view schematically illustrating a shape of a subpixel of a light emitting display device according to the first embodiment of the present disclosure.
Figure 4:
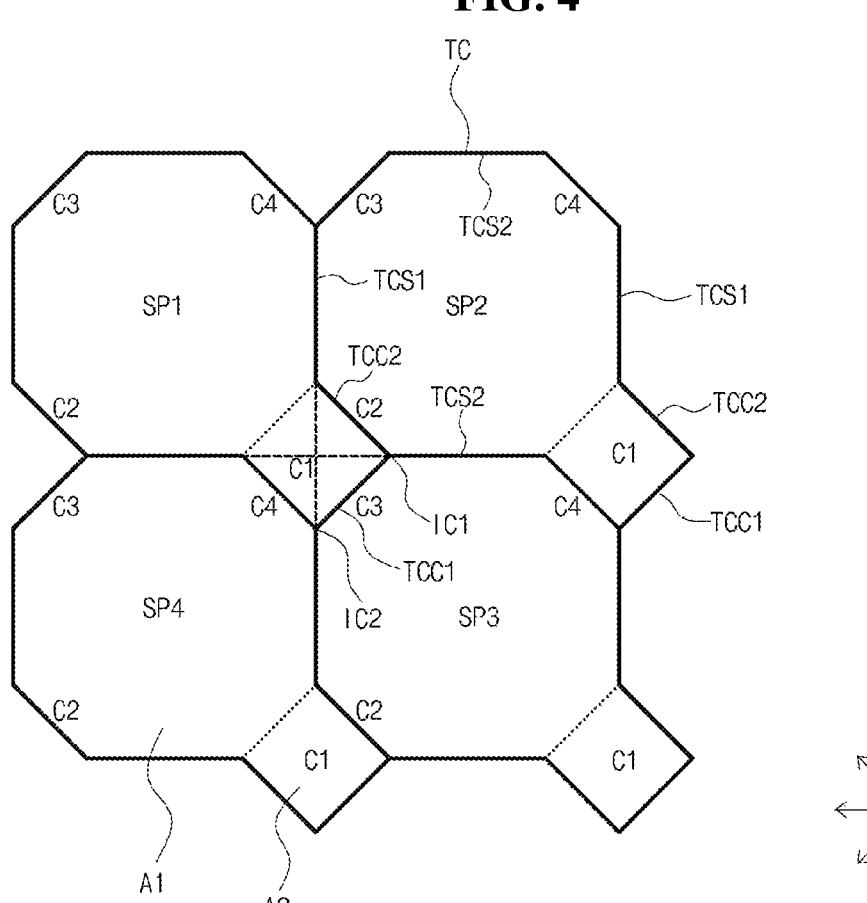
FIG. 4 is a view schematically illustrating four neighboring subpixels and a trench formed at their boundary in a light emitting display device according to the first embodiment of the present disclosure.
Figure 5:
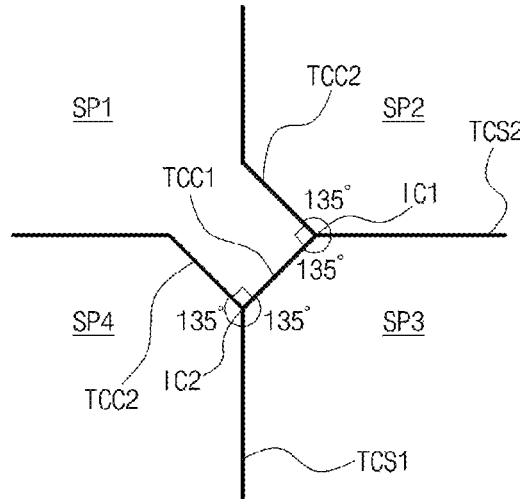
FIG. 5 is a view enlarging a protruding first corner of the subpixel of FIG. 4 and its surroundings according to one embodiment.

Structure and arrangement of the subpixel SP and the trench TC are described in more detail with further reference to FIGS. 3 to 5 along with FIG. 1.

FIG. 3 is a view schematically illustrating a shape of a subpixel of a light emitting display device according to the first embodiment of the present disclosure. FIG. 4 is a view schematically illustrating four neighboring subpixels and a trench formed at their boundary in a light emitting display device according to the first embodiment of the present disclosure. FIG. 5 is a view enlarging a protruding first corner of the subpixel of FIG. 4 and its surroundings according to one embodiment.

Meanwhile, for convenience of explanation, in the subpixel SP of this embodiment, its right edge portion may be referred to as a first side portion, its left edge portion opposite to the right edge portion may be referred to as a third side portion, its lower edge portion may be referred to as a second side portion, and its upper edge portion opposite to the lower edge portion may be referred to as a fourth side portion. That is, the right, lower, left, and upper edge portions located along a clockwise direction may be referred to as the first, second, third, and fourth side portions.

First, referring to FIG. 3 regarding the shape of the subpixel SP of this embodiment, the subpixel SP may be configured based on a square-shaped subpixel SPo.

In this regard, the square subpixel SPo is shown on a left of FIG. 3, and the subpixel SP of this embodiment, which has a shape modified from the square subpixel SPo, is shown on a right of FIG. 3.

The square subpixel SPo has a first corner portion a1 and a third corner portion a3, which each have a form of a right-angled isosceles triangle with an inner angle at a right angle (i.e., 90 degrees), on a lower right side and an upper left side which are opposite sides of the first diagonal direction DD1; and has a second corner portion a2 and a fourth corner portion a4, which each have in a form of a right-angled isosceles triangle with an inner angle at a right angle, on a lower left side and a upper right side which are opposite sides of the second diagonal direction DD2.

For the square subpixel SPo, its three corner portions, for example, the second, third, and fourth corner portions a2, a3, and a4 may be cut out, and these corner portions a2, a3, and a4 may be placed on a right side, a diagonal side, and a lower side of the first corner a1.

In this way, the subpixel SP of this embodiment shown on the right of FIG. 3 may be formed. It can be said that the subpixel SP of this embodiment may be formed in a form of a table tennis stick which has a handle shape on one side, for example, the lower right side in the first diagonal direction DD1.

In this regard, in the subpixel SP of this embodiment, each of the three corner portions i.e., each of the second, third, and fourth corner portions C2, C3, and C4 may have a chamfer shape (or trapezoid) in which a right-angled isosceles triangle part is cut out.

In this regard, the second corner portion C2 located between the lower second side portion and the left third side portion adjacent to each other in the subpixel SP may have a chamfer shape with a boundary line (or boundary surface) inclined along the first diagonal direction DD1. The third corner portion C3 located between the left third side portion and the upper fourth side portion adjacent to each other may have a chamfer shape with a boundary line inclined along the second diagonal direction DD2. The fourth corner portion C4 located between the upper fourth side portion and the right first side portion adjacent to each other may have a chamfer shape with a boundary line inclined along the first diagonal direction DD1.

In addition, the first corner portion C1, which is the remaining corner of the subpixel SP and is located between the first side portion and the second side portion adjacent to each other, may have a protruding shape of a square in which four right-angled isosceles triangles are combined.

In this regard, the first corner portion C1 has a square shape that substantially complements the modified chamfer shape of the second, third, and fourth corner portions C2, C3, and C4, so that the first corner portion C1 may have three boundary lines corresponding to (or substantially equal to) the boundary lines of the second, third, and fourth corner portions C2, C3, and C4.

That is, the first corner portion C1 may have a boundary line, corresponding to the boundary line of the third corner portion C3, which is located in front of the protruding direction (for example, in front of a3 in the drawing) and inclined along the second diagonal direction DD2; a boundary line, corresponding to the boundary line of the second corner portion C2, which is located on one side of the first corner portion C1 (for example, on one side of a2 in the drawing) and inclined along the first diagonal direction DD1; and a boundary line, corresponding to the boundary line of the fourth corner portion C4, which is located on the other side of the first corner portion C1 (for example, on one side of a4 in the drawing) and inclined along the first diagonal direction DD1.

As such, in the subpixel SP of this embodiment, the first corner portion C1, which is one of the four corner portions, may have a shape that protrudes to one side in the first diagonal direction DD1, and the remaining second, third, and fourth corner portions. The corner portions C2, C3, and C4 may each have a chamfer shape inclined in the corresponding diagonal direction.

According to the shape of the subpixel SP, the subpixel SP may be divided into the first region A1 having the second, third, and fourth corner portions C2, C3, and C4, and the second region A2 having the first corner portion C1.

In this regard, a region occupied by the first corner portion C1 in the subpixel SP may be substantially defined as the second region A2. Accordingly, the second region A2 may be configured in a square shape on one diagonal side of the subpixel SP.

The first region A1 of the subpixel SP may substantially have the four inclined chamfer-shaped corner portions. In this regard, the first region A1 may have the second, third, and fourth corner portions C2, C3, and C4 of the subpixel SP as its three outer corner portions, and further, it can be said that the first region A1 may have an inclined corner portion located at the boundary with the second region A2 as its one inner corner portion.

The subpixel SP of this structure may be arranged repeatedly along the row direction LD1 and the column direction LD2 within the display region to form a matrix.

The arrangement of the subpixels SP and the structure and arrangement of the trench TC are described with reference to FIGS. 1 and 4.

The trench TC may be formed at the boundary of each subpixel SP, that is, at the boundary between the neighboring subpixels SP. Accordingly, each subpixel SP may be distinguished from its neighboring subpixels SP.

In this embodiment, the subpixels SP may be arranged so that all of their protruding corner portions have the same direction (or same orientation). In other words, the protruding corner portions of the subpixels SP may be the first corner portions C1 located at the lower right side in the first diagonal direction DD1.

In this case, the second, third, and fourth corner portions C2, C3, and C4, which are the remaining inclined corner portions of each subpixel SP, may be arranged, for example, in a clockwise direction. In other words, the second, third, and fourth corner portions C2, C3, and C4 may be respectively located on the lower left side of the second diagonal direction DD2, the upper left side of the first diagonal direction DD1, and the upper right side of the second diagonal direction DD2.

Alternatively, the corner portion at a different position from the first corner portion C1 may be configured to have a protruding shape.

As described above with reference to FIG. 3, the first corner portion C1 of each subpixel SP may have a square shape in which four right-angled isosceles triangles are combined. Accordingly, the first corner portion C1 may be configured such that the first corner portion C1 is inserted like a puzzle piece within a space (or region) surrounded by the inclined second, third, and fourth corner portions C2, C3, and C4 of the neighboring subpixels SP.

For example, the first corner portion C1 of the first subpixel SP1 may be placed in a recessed space surrounded by the second corner portion C2 of the second subpixel SP2, the third corner portion C3 of the third subpixel SP3, and the fourth corner portion C4 of the fourth subpixel SP4.

From another perspective, it can be said that the first corner portion C1 of the first subpixel SP1 may be placed in an internal space surrounded and defined by the inner corner portion of the first region A1 of the first subpixel SP1 contacting the first corner portion C1, and the second, third, and fourth corner portions C2, C3, and C4 of the first regions A1 of the second, third, and fourth subpixels SP2, SP3, and SP4.

As such, it can be said that the first corner portion C1 of the first subpixel SP1 substantially occupies the three isosceles triangle parts, which remain as the three corner portions C2, C3 and C4 of the three subpixels SP2, SP3 and SP4 adjacent to the first corner portion C1 of the first subpixel SP1 are each transformed into a chamfer shape so that the first corner portion C1 of the first subpixel SP1 has a protruding square shape.

The first corner portion C1 may have in-corner side portions as edge portions which respectively correspond to (or face) the second, third, and fourth corner portions C2, C3, and C4 of the second, third, and fourth subpixels SP2, SP3, and SP4.

For example, the first corner portion C1 may have a first in-corner side portion that faces the third corner portion C3 of the third subpixel SP3 and forms a boundary line in the second diagonal direction DD2, a second in-corner side portion that faces the second corner portion C2 of the second subpixel SP2 and forms a boundary line in the first diagonal direction DD1, and a third in-corner side portion that faces the fourth corner portion C4 of the fourth subpixel SP4 and forms a boundary line in the first diagonal direction DD1.

Meanwhile, between the first and second subpixels SP1 and SP2 adjacent in the row direction LD1 (more specifically, between the first and third side portions thereof facing each other) and between the third and fourth subpixels SP3 and SP4 adjacent in the row direction LD1 (more specifically, between the first and third side portions thereof facing each other), a boundary line in the column direction LD2 may be formed.

In addition, between the first and fourth subpixels SP1 and SP4 adjacent in the column direction LD2 (more specifically, between the second and fourth side portions thereof facing each other) and between the second and third subpixels SP2 and SP3 (more specifically, between the second and fourth side portions thereof facing each other), a boundary line in the row direction LD1 may be formed.

According to the structure and arrangement of the subpixels SP as above, the boundary line which is located on one side, for example, on the right side of the subpixels SP on each column line and extends along the column line (or the boundary line which is between the neighboring column lines) may have a shape that protrudes to the right along the shape of the first corner portion C1. That is, the boundary line of the column line may be configured with portions extending along the column direction LD2 and portions connected between the extended portions and protruding in a form of a right-angled isosceles.

In addition, the boundary line which is located on one side, for example, on the lower side of the subpixels SP on each row line and extends along the row line (or the boundary line which is between the neighboring row lines) may have a shape that protrudes downward along the shape of the first corner portion C1. That is, the boundary line of the row line may be configured with portions extending along the row direction LD1 and portions connected between the extended portions and protruding in a form of a right-angled isosceles.

The boundary line of the row line and the boundary line of the column line may share a front boundary portion of the first corner portion C1 i.e., a boundary portion along the second diagonal direction DD2.

As the partially protruding column boundary lines and the partially protruding row boundary lines intersect, subpixels SP surrounded by them may be defined.

The trench TC which is formed along the boundaries of the subpixels SP having the above structure and arrangement and surrounds each of the subpixels SP may include side grooves TCS and corner grooves TCC.

The side groove TCS may be located at the outer boundary of the side portion of the subpixel SP, and the corner groove TCC may be located at the outer boundary of the corner portion of the subpixel SP.

In this regard, the side groove TCS may be located at the boundaries of the side portions on both sides i.e., right and left sides in the row direction LD1 of the subpixel SP, and may be located at the boundaries of the side portions on both sides i.e., on lower and upper sides in the column direction LD2 of the subpixel SP.

In other words, the side groove TCS may be located at the boundary between the side portions of the subpixels SP neighboring in the row direction LD1, and may be located on the side portions of the subpixels SP neighboring in the column direction LD2.

Here, for convenience of explanation, the side groove TCS located at the boundary line between the side portions of the subpixels SP in the row direction LD1 may be referred to as a first side groove TCS1, and the side groove TCS located at the boundary line between the side portions of the subpixels SP in the column direction LD2 may be referred to as a second side groove TCS2.

For example, the first side groove TCS1 extending in the column direction LD2 may be formed at the boundary lines of the right and left side portions of each of the first to fourth subpixels SP1 to SP4. That is, the first side groove TCS1 may be interposed between the first and second subpixels SP1 and SP2 adjacent in the row direction LD1, and between the third and fourth subpixels SP3 and SP4 adjacent in the row direction LD1.

The second side groove TCS2 extending in the row direction LD1 may be formed at the boundary lines of the lower and upper side portions of each of the first to fourth subpixels SP1 to SP4. That is, the second side groove TCS2 may be interposed between the first and fourth subpixels SP1 and SP4 adjacent in the column direction LD2, and between the second and third subpixels SP2 and SP3 adjacent in the column direction LD2.

The corner groove TCC may be located at the boundary lines of the first and third corner portions C1 and C3 on both sides in the first diagonal direction DD1 of the subpixel SP and may be located on the boundary lines of the second and fourth corner portions C2, C4 on both sides in the second diagonal direction DD2 of the subpixel SP.

In this regard, the corner groove TCC may be located at the boundary line between the corner portions of the subpixels SP adjacent in the first diagonal direction DD1, and further, may be located at the boundary line between the corner portions of the subpixels SP adjacent in the row direction LD1 and be located at the boundary line between the corner portions of the subpixels SP adjacent in the column direction LD2.

Here, for convenience of explanation, the corner groove TCC, which is located on the boundary line between the first and third corner portions C1 and C3 in the first diagonal direction DD1 and extends in the second diagonal direction DD2, may be referred to as a first corner groove TCC1. The corner groove TCC, which is located between the first and second corner portions C1 and C2 in the second diagonal direction DD2 and between the first and fourth corner portions C1 and C4 in the second diagonal direction DD2 and extends in the first diagonal direction DD1, may be referred to as a second corner groove TCC2.

In each subpixel SP, the second corner grooves TCC2 along the first diagonal direction DD1 may be disposed on the inclined boundary lines of the corresponding chamfer-shaped second and fourth corner portions C2 and C4. For example, there is a second corner groove TCC2 between the chamfered second corner portion C2 of subpixel SP2 and the first corner portion C1 of the first subpixel SP1 and there is a second corner groove TCC2 between the chamfered fourth corner portion C4 of the fourth subpixel SP4 and the first corner portion C1 of the first subpixel SP1. The first corner groove TCC1 along the second diagonal direction DD2 may be disposed on the inclined boundary line of the corresponding chamfer-shaped third corner portion C3.

Meanwhile, the first corner portion C1 of each subpixel SP may have a protruding quadrangular shape so that it has a boundary line in the second diagonal direction DD2 and boundary lines in the first diagonal direction DD1 that perpendicularly contact both ends of the boundary line in the second diagonal direction DD2. Accordingly, at the boundary lines of the first corner portion C1, the first corner groove TCC1 in the second diagonal direction DD2 and two second corner grooves TCC2 in the first diagonal direction DD1, which face each other and contact one end and the other end of the first corner groove TCC1, may be placed.

Here, a point where the second corner groove TCC2 located on the boundary line with the second subpixel SP2 and the first corner groove TCC1 contact each other may be referred to as a first contact point (or first intersection point) IC1 as shown in FIG. 5, and a point where the second corner groove TCC2 located on the boundary line with the fourth subpixel SP4 and the first corner groove TCC1 contact each other may be referred to as a second contact point (or second intersection point) IC2. It can be said that the first contact point IC1 and the second contact point IC2 correspond to two vertices of the first corner portion C1 which are located in front of the first corner portion C1 in its protruding direction.

In one embodiment, a second corner groove TCC2 has a first end that is connected to an end of the first side groove TCS1 and a second end that is connected to a first end of the first corner groove TCC1 at the first contact point IC1 in the plan view shown in FIG. 4. A second end of the first corner groove TCC1 may be connected to a first end of another second corner groove TCC2 at the second contact point IC2 in the plan view. A second end of the another second corner groove TCC2 is connected to an end of a second side groove TCS2 in the plan view.

To the first contact point IC1 of the first corner portion C1, the second side groove TCS2 between the subpixels SP which are located around the first contact point IC1 and are adjacent to each other in the column direction LD2, for example, the second and third subpixels SP2 and SP3 may be connected. That is, one end of the second side groove TCS2 may be connected to the first contact point IC1.

In addition, to the second contact point IC2 of the first corner portion C1, the first side groove TCS1 between the subpixels which are located around the second contact point IC2 and are adjacent to each other in the row direction LD1, for example, between the third and fourth subpixels SP3 and SP4 may be connected. That is, one end of the first side groove TCS1 may be connected to the second contact point IC2.

According to the structure and arrangement of the trench TC as above, the trench TC disposed in the boundary line which is located on one side, for example, on the right side of the subpixels SP on each column line and extends along the column line (or the boundary line which is between the neighboring column lines) may have a shape that protrudes to the right along the shape of the first corner portion C1. This trench TC extending along the boundary line of the column line may be referred to as a first trench line.

The first trench line may be configured with the first side grooves TCS1 in the column direction LD2, and the first and second corner grooves TCC1 and TCC2 which are connected between the neighboring first side grooves TCS1 and form a part protruding in a form of a right-angled isosceles.

In addition, the trench TC disposed in the boundary line which is located on one side, for example, on the lower side of the subpixels SP on each row line and extends along the row line (or the boundary line which is between the neighboring row lines) may have a shape that protrudes downward along the shape of the first corner portion C1. This trench TC extending along the boundary line of the row line may be referred to as a second trench line.

The second trench line may be configured with the second side groove TCS2 in the row direction LD1, and the first and second corner grooves TCC1 and TCC2 which are connected between the neighboring second side grooves TCS2 and form a part protruding in a form of a right-angled isosceles.

The first trench line and the second trench line that intersect each other may share the first corner groove TCC1 of the first corner portion C1.

As the partially protruding first trench lines and the partially protruding second trench lines intersect, the subpixels SP surrounded by them may be defined.

As above, in this embodiment, with the protruding first corner portion C1 as a center, the first to fourth subpixels SP1 to SP4 adjacent to each other including the first subpixel SP1 to which the first corner portion C1 belongs may be disposed.

Accordingly, the first to fourth corner portions C1 to C4, adjacent to each other, of the first to fourth subpixels SP1 to SP4 may be arranged such that with the protruding first corner portion C1 as a center, the second, third, and fourth corner portions C2, C3, and C4 may surround the first corner portion C1.

Due to this arrangement structure, the second and fourth subpixels SP2 and SP4 adjacent in the second diagonal direction DD2 may be spaced apart from each other with the first corner portion C1 of the first subpixel SP1 interposed therebetween.

Accordingly, the first corner portion C1 of the first subpixel SP1, and the second and third corner portions C2 and C3 of the second and third subpixels SP2 and SP3 which are located in the column line neighboring to the first subpixel SP1 may be arranged adjacent to each other around the first contact point IC1. In addition, the first corner portion C1 of the first subpixel SP1, and the third and fourth corner portions C3 and C4 of the third and fourth subpixels SP3 and SP4 which are located in the row line neighboring to the first subpixel SP1 may be arranged adjacent to each other around the second contact point IC2.

As a result, the boundary between the first, second, and third subpixels SP1, SP2, and SP3 may have a Y shape, and the trench TC located at this boundary may have a Y shape at an end of the trench TC in the plan view of the display device.

In this regard, referring to FIG. 5 together, the first corner groove TCC1, the second corner groove TCC2, and the second side groove TCS2, which are portions of the trench TC in three different directions from the first contact point IC1, meet to form the Y-shaped trench TC, and the intersection angles between these three trench portions may be 90 degrees, 135 degrees, and 135 degrees.

Similarly, the boundary between the first, third, and fourth subpixels SP1, SP3, and SP4 may have a Y shape, and the trench TC located at this boundary has a Y shape.

In this regard, the first corner groove TCC1, the second corner groove TCC2, and the first side groove TCS1, which are portions of the trench TC in three different directions from the second contact point IC2, meet to form the Y-shaped trench TC, and the intersection angles between these three trench parts may be 90 degrees, 135 degrees, and 135 degrees.

As such, in this embodiment, where the adjacent subpixels SP meet, the trench TC disposed at the boundary between them may be formed in a "Y" shape with the intersection angles of 90 degrees, 135 degrees, and 135 degrees. Since such the intersection angles meet a level applicable to the OPC design, the trench TC having the desired width can be formed through a mask process to which the OPC design is applied.

In this regard, as mentioned above, in a display device in which rectangular subpixels are arranged, four corners with intersection angles of 90 degrees meet each other, which limits the application of the OPC design.

On the other hand, in this embodiment, a single corner has an intersection angle of 90 degrees and the remaining two corners have the greater intersection angle of 135 degrees, so that the OPC design is applicable.

Meanwhile, in this embodiment, as mentioned above, the subpixel SP is a modified square shape and has substantially the same area as a square. Accordingly, compared to a case of using rectangular subpixels, an aperture ratio increases.

Figure 6:
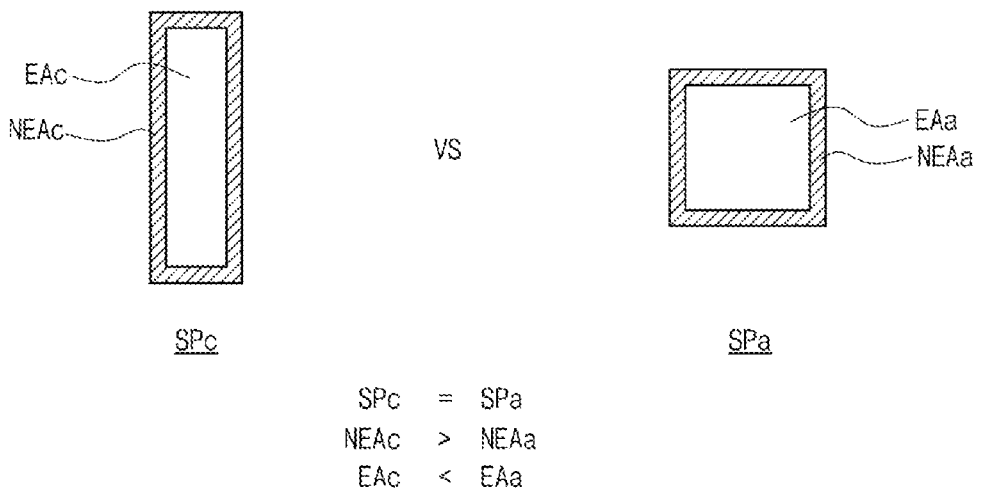
FIG. 6 is a view comparing an aperture ratio of a rectangular-shaped subpixel and a square-shaped subpixel according to one embodiment.

This is explained with further reference to FIG. 6. FIG. 6 is a view comparing an aperture ratio of a rectangular-shaped subpixel and a square-shaped subpixel.

Referring to FIG. 6, the rectangular subpixel SPc shown on the left includes an emission region EAc and a non-emission region NEAc surrounding the emission region EAc. The square subpixel SPa shown on the right includes an emission region EAa and a non-emission region NEAa surrounding the emission region EAa.

Here, an area of the rectangular subpixel SPc and an area of the square subpixel (SPa) are set to be the same. Additionally, a width of the non-emission region NEAc of the rectangular subpixel SPc and a width of the non-emission region NEAa of the square subpixel SPa are set to be the same.

In this case, since a perimeter of the non-emission region NEAc of the rectangular subpixel SPc is larger than a perimeter of the non-emission region NEAa of the square subpixel SPa, the non-emission region NEAc of the rectangular subpixel SPc has the area greater than that of the non-emission region NEAa of the square subpixel SPa.

Accordingly, an area of the emission region EAa of the square subpixel SPa is greater than that of the emission region EAc of the rectangular subpixel SPc.

In this regard, for example, in a case in which a width and a height of the rectangular subpixel SPc are 2.42 μm and 7.26 μm respectively, and a width of the non-emission region NEAc is 0.41 μm; and a width and a height of the square subpixel SPa are both 4.19 μm, and a width of the non-emission region NEAa is 0.41 μm, areas of the subpixels SPc and SPa are the same as 17.56 μm², and an area of the rectangular emission region EAc is 10.30 μm², and an area of the square emission region EAa is 11.35 μm². Accordingly, the aperture ratio of the rectangular subpixel SPc is 58.6% and the aperture ratio of the square subpixel SPa is 64.6%, so that the aperture ratio of the square subpixel SPa is significantly higher than that of the rectangular subpixel SPc.

As mentioned above, the subpixel of this embodiment is based on the square and has the corner portions of the square changed in shape, so that it has a level that is substantially the same as or very close to the aperture ratio of a square.

Therefore, the light emitting display device of this embodiment can improve the aperture ratio.

Meanwhile, in this embodiment, the subpixels are based on the square and have the corner portions of the square changed in shape, and the subpixels can implement various pixel structures including RGBW structure, pentile structure, and delta structure. For example, regarding the RGBW structure, this structure can be implemented by arranging the subpixels of this embodiment as R, G, B, and W subpixels in 2 rows*2 columns. Regarding the RGBG pentile structure, this structure can be implemented by arranging the subpixels of this embodiment as R and B subpixels in two rows of a first column and G and G subpixels in the two rows of a second column.

Second Embodiment

Figure 7:
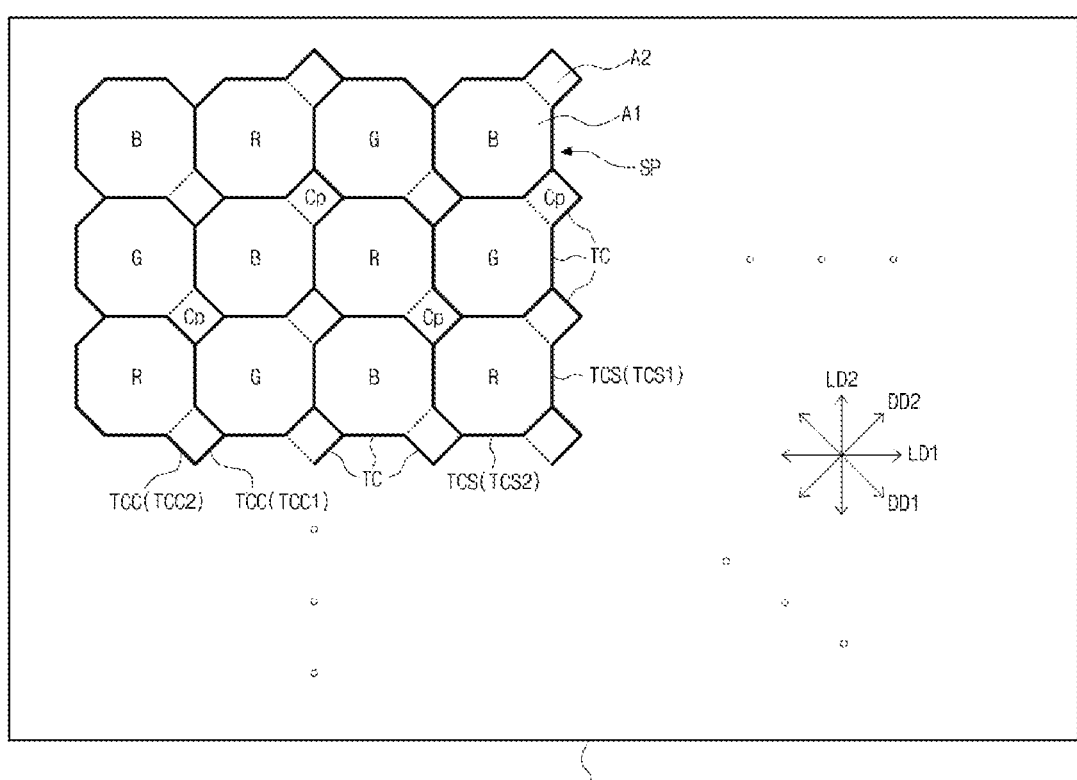
FIG. 7 is a plan view schematically illustrating a light emitting display device according to a second embodiment of the present disclosure.

FIG. 7 is a plan view schematically illustrating a light emitting display device according to a second embodiment of the present disclosure.

In the following description, detailed descriptions of configurations identical or similar to those of the above-described first embodiment may be omitted.

Referring to FIG. 7, in the light emitting display device 10 of this embodiment, each subpixel SP may include a first region A1 having an emission region, and a protruding second region A2 located on one diagonal side of the first region A1.

The subpixel SP may have four corner portions, of which three corner portions may have an inclined chamfer shape and the remaining corner portion Cp may have a protruding square shape.

The first region A1 may have three corner portions in a chamfer shape, and the second region A2 may have one corner portion Cp in a protruding form.

A light emitting diode may be provided at the emission region in the first region A1. In the second region A2, the light emitting diode and a thin film transistor may be connected to each other.

A trench TC surrounding each subpixel SP may be formed along a boundary of each subpixel SP. As such, the trench TC may be formed at the boundary between the neighboring subpixels SP to separate them.

In this embodiment, the protruding corner portions Cp may be configured to alternate in direction along the row line.

In this regard, in the above-described first embodiment, all subpixels SP are configured such that their protruding corner portions have the same direction.

In contrast, in the second embodiment the subpixels SP arranged along each row line may be configured such that the directions of the protruding corner portions Cp may alternate in the first diagonal direction DD1 and the second diagonal direction DD2.

For example, for the subpixels SP arranged in the second row in FIG. 7, the subpixel SP located in the odd column line may have its protruding corner portion located on the lower right side and facing the first diagonal direction DD1, and the subpixel SP located in the even column line may have its protruding corner located on the upper right side and facing the second diagonal direction DD2.

According to the structure and arrangement of the subpixels SP, a first trench line, which is the trench TC disposed in the boundary line that is located on one side, for example, on the right side of the subpixels PS on each column line and extends along the column line (or a boundary line which is between the neighboring column lines), may have a shape that protrudes to the right along the shape of the protruding corner portion C1.

The first trench line may be configured with the first side grooves TCS1 in the column direction LD2, and the first and second corner grooves TCC1 and TCC2 which are connected between the neighboring first side grooves TCS1 and form a part protruding in a form of a right-angled isosceles.

In addition, a second trench line, which is the trench TC disposed in the boundary line that is located on one side, for example, on the lower side of the subpixels SP on each row line and extends along the row line (or a boundary line which is between the neighboring row lines), may have a shape that alternately protrudes downward and upward along the shape of the protruding corner portion Cp.

The second trench line may be configured with the second side groove TCS2 in the row direction LD1, and the first and second corner grooves TCC1 and TCC2 which are connected between the neighboring second side grooves TCS2 and form a part protruding in a form of a right-angled isosceles.

The first trench line and the second trench line may alternately share the first and second corner grooves TCC1 and TCC2 of the protruding corner portion Cp.

As the partially protruding first trench lines and the partially protruding second trench lines intersect, the subpixels SP surrounded by them may be defined.

In this embodiment configured as above, the protruding corner portions Cp may be alternately arranged in opposite diagonal directions on the row line. In this way, subpixel patterns in the same direction are not repeated, and phenomenon of the same pattern being visible can be relieved.

The light emitting display device 10 of this embodiment can have the effects and advantages mentioned in the first embodiment.

Third Embodiment

Figure 8:
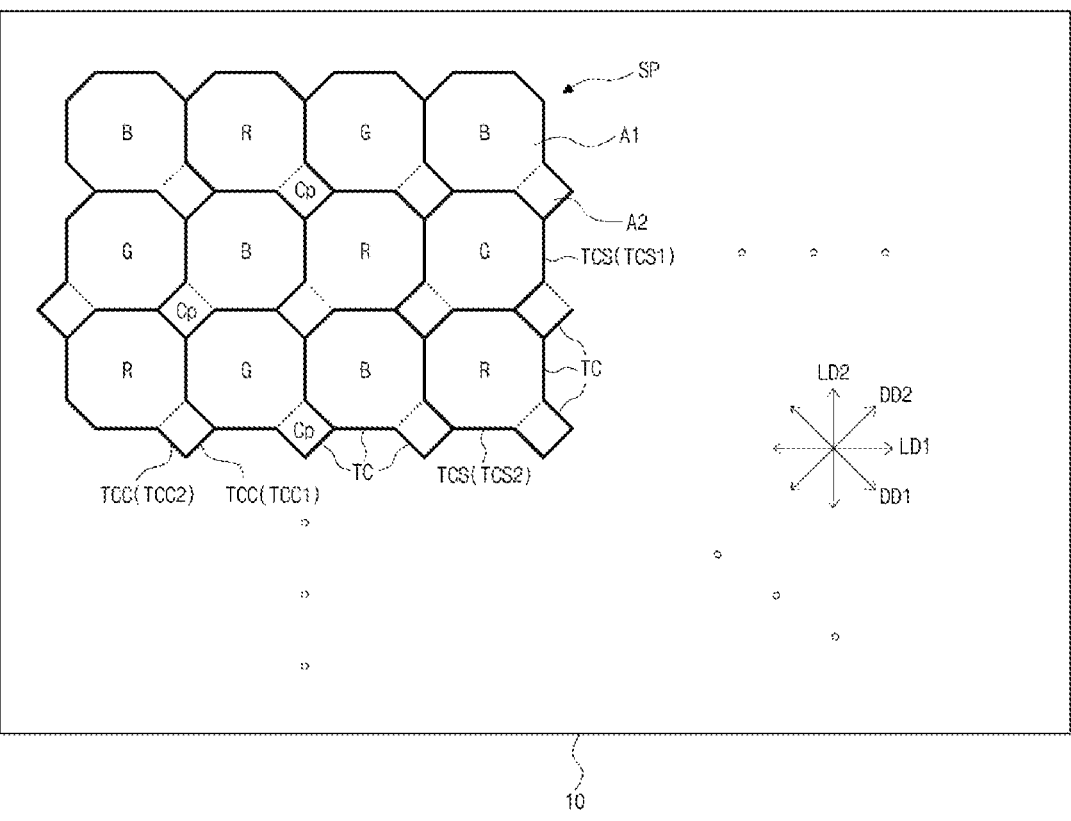
FIG. 8 is a plan view schematically illustrating a light emitting display device according to a third embodiment of the present disclosure.

FIG. 8 is a plan view schematically illustrating a light emitting display device according to a third embodiment of the present disclosure.

In the following description, detailed descriptions of configurations identical or similar to those of the first and second embodiments described above may be omitted.

Referring to FIG. 8, in the light emitting display device 10 of this embodiment, each subpixel SP may include a first region A1 having an emission region, and a protruding second region A2 located on one diagonal side of the first region A1.

The subpixel SP may have four corner portions, of which three corner portions may have an inclined chamfer shape and the remaining corner portion Cp may have a protruding square shape.

The first region A1 may have three corner portions in a chamfer shape, and the second region A2 may have one corner portion Cp in a protruding form.

A light emitting diode may be provided at the emission region in the first region A1. In the second region A2, the light emitting diode and a thin film transistor may be connected to each other.

A trench TC surrounding each subpixel SP may be formed along a boundary of each subpixel SP. As such, the trench TC may be formed at the boundary between the neighboring subpixels SP to separate them.

In this embodiment, the protruding corner portions Cp may be configured to alternate in direction along the column line.

In this regard, in the above-described first embodiment, all subpixels SP are configured such that their protruding corner portions have the same direction.

In this embodiment, the subpixels SP arranged along each column line may be configured such that the directions of the protruding corner portions Cp may alternate in the first diagonal direction DD1 and the second diagonal direction DD2.

For example, for the subpixels SP arranged in the second column in FIG. 8, the subpixel SP located in the odd row line may have its protruding corner portion located on the lower right side and facing the first diagonal direction DD1, and the subpixel SP located in the even row line may have its protruding corner located on the lower left side and facing the second diagonal direction DD2.

According to the structure and arrangement of the subpixels SP, a first trench line, which is the trench TC disposed in the boundary line that is located on one side, for example, on the right side of the subpixels SP on each column line and extends along the column line (or a boundary line which is between the neighboring column lines), may have a shape that alternately protrudes to the right and left along the shape of the protruding corner portion Cp.

The first trench line may be configured with the first side grooves TCS1 in the column direction LD2, and the first and second corner grooves TCC1 and TCC2 which are connected between the neighboring first side grooves TCS1 and form a part protruding in a form of a right-angled isosceles.

In addition, a second trench line, which is the trench TC disposed in the boundary line that is located on one side, for example, on the lower side of the subpixels SP on each row line and extends along the row line (or a boundary line which is between the neighboring row lines), may have a shape that protrudes downward along the shape of the protruding corner portion Cp.

The second trench line may be configured with the second side groove TCS2 in the row direction LD1, and the first and second corner grooves TCC1 and TCC2 which are connected between the neighboring second side grooves TCS2 and form a part protruding in a form of a right-angled isosceles.

The first trench line and the second trench line may alternately share the first and second corner grooves TCC1 and TCC2 of the protruding corner portion Cp.

As the partially protruding first trench lines and the partially protruding second trench lines intersect, the subpixels SP surrounded by them may be defined.

In this embodiment configured as above, the protruding corner portions Cp may be alternately arranged in opposite diagonal directions on the column line. In this way, subpixel patterns in the same direction are not repeated, and phenomenon of the same pattern being visible can be relieved.

The light emitting display device 10 of this embodiment can have the effects and advantages mentioned in the first embodiment.

As described above, according to the embodiments of the present disclosure, the trench is formed along the boundary of the subpixel, so that the light emitting layers of the neighboring subpixels can be physically separated from each other. Accordingly, the occurrence of leakage current through the light emitting layer between the neighboring subpixels can be prevented.

In addition, based on a square subpixel, its right-angled corner portions are modified to form a subpixel in which three corner portions have a chamfered shape and the remaining corner portion has a protruding square shape. Accordingly, the trench, which is formed at the boundaries between the adjacent subpixels meeting each other, can be formed in a "Y" shape with intersection angles of 90 degrees, 135 degrees, and 135 degrees, the trench of the desired width can be formed through a mask process using the OPC design. As a result, the light emitting layer can be separated between the neighboring subpixels by the trench.

In addition, since the subpixel whose corner portions are modified in shape based on a square is used, a high level of aperture ratio that is substantially the same as or very close to that of a square can be realized.

In addition, since the subpixel whose corner portions are modified in shape based on a square is used, various pixel structures including RGBW structure, pentile structure, and delta structure can be implemented.

In addition, the protruding corner portions can be alternately arranged in opposite diagonal directions on the row line or column line. In this case, subpixel patterns in the same direction are not repeated, and the phenomenon of the same pattern being visible can be relieved.

It will be apparent to those skilled in the art that various modifications and variation can be made in the present disclosure without departing from the spirit or scope of the invention. Thus, it is intended that the present invention cover the modifications and variations of this invention provided they come within the scope of the appended claims and their equivalents.

What is claimed is:

1. A light emitting display device, comprising:

a substrate;

a plurality of subpixels arranged in a matrix form along a plurality of row lines and a plurality of column lines on the substrate;

a plurality of first electrodes, each first electrode on a subpixel from the plurality of subpixels;

a bank that that covers an edge of the plurality of first electrodes, the bank including a trench along a boundary between neighboring subpixels from the plurality of subpixels;

a plurality of light emitting layers, each light emitting layer located on a corresponding first electrode from the plurality of first electrodes, and the plurality of light emitting layers separated from each other by the trench; and a second electrode on the plurality of light emitting layers, wherein the plurality of subpixels include a first subpixel and a second subpixel adjacent to each other in a row direction, and a fourth subpixel and a third subpixel that are respectively adjacent to the first subpixel and the second subpixel in a column direction, and each of the first subpixel, the second subpixel, the third subpixel, and the fourth subpixel includes a quadrangular protruding corner portion and three inclined corner portions, wherein the trench includes:

a first corner groove that extends in a second diagonal direction and is at a boundary between a protruding corner portion of the first subpixel in a first diagonal direction of the first subpixel and an inclined corner portion of the third subpixel that is adjacent to the protruding corner portion of the first subpixel;

second corner grooves in a first diagonal direction and are at a boundary between the protruding corner portion of the first subpixel and an inclined corner portion of the second subpixel and at a boundary between the protruding corner portion of the first subpixel and an inclined corner portion of the fourth subpixel, the second corner grooves connected to the first corner groove at a first contact point and a second contact point;

a first side groove in the column direction and at a boundary between the first subpixel and the second subpixel and at a boundary between the third subpixel and the fourth subpixel; and a second side groove in the row direction and at a boundary between the second subpixel and the third subpixel and at a boundary between the first subpixel and the fourth subpixel, wherein the second side groove at the boundary between the second subpixel and the third subpixel is connected to the first contact point, and the first side groove at the boundary between the third subpixel and the fourth subpixel is connected to the second contact point.

2. The light emitting display device of claim 1, wherein the first side groove at the boundary between the first subpixel and the second subpixel is connected to a second corner groove from the second corner grooves at the first contact point, and the second side groove at the boundary between the first subpixel and the fourth subpixel is connected to another second corner groove from the second corner grooves at the second contact point.

3. The light emitting display device of claim 1, wherein a direction at which each of protruding corner portions of the plurality of subpixels protrudes is a same.

4. The light emitting display device of claim 1, wherein protruding corner portions of subpixels in a first row line from the plurality of row lines protrude in the first diagonal direction and protruding corner portions of subpixels in a second row line from the plurality of row lines protrudes in the second diagonal direction.

5. The light emitting display device of claim 1, wherein protruding corner portions of subpixels in a first column line from the plurality of column lines protrude in the first diagonal direction and protruding corner portions of subpixels in a second column line from the plurality of column lines protrudes in the second diagonal direction.

6. The light emitting display device of claim 1, wherein the protruding corner portion of each of the plurality of subpixels has a square shape.

7. The light emitting display device of claim 6, wherein the protruding corner portion of each subpixel from the plurality of subpixels has a square shape based on a combination of four right-angled isosceles triangle portions, wherein responsive to a combination of the three inclined corner portions of the subpixel with three right-angled isosceles triangle portions corresponding to the three inclined corner portions of the subpixel, respectively, a square-shaped subpixel is formed.

8. The light emitting display device of claim 1, further comprising:

a plurality of thin film transistors, each thin film transistor located at the protruding corner portion of a corresponding subpixel from the plurality of subpixels;

at least one insulating layer between the plurality of thin film transistors and the plurality of first electrodes; and contact holes through the at least one insulating layer, wherein each of the plurality of first electrodes is connected to one of the plurality of thin film transistors through a corresponding one of the contact holes at a corresponding protruding corner portion.

9. The light emitting display device of claim 8, wherein the trench extends through the at least one insulating layer.

10. The light emitting display device of claim 9, wherein the at least one insulating layer includes a first insulating layer, a second insulating layer on the first insulating layer, and a third insulating layer on the second insulating layer, and the plurality of subpixels include a red subpixel, a green subpixel, and a blue subpixel, the light emitting display device further comprising:

a first reflector in the red subpixel and between the first insulating layer and the second insulating layer, a second reflector in the green subpixel and between the second insulating layer and the third insulating layer, and a third reflector in the blue subpixel and between the third insulating layer and a first electrode from the plurality of first electrodes.

11. The light emitting display device of claim 1, wherein the plurality of light emitting layers emit white light.

12. A light emitting display device, comprising:

a substrate;

a plurality of subpixels arranged in a matrix form along a plurality of row lines and a plurality of column lines on the substrate;

a plurality of first electrodes, each first electrode on a subpixel from the plurality of subpixels;

a bank that covers an edge of the plurality of first electrodes, the bank including a trench along a boundary between neighboring subpixels from the plurality of subpixels;

a plurality of light emitting layers, each light emitting layer located on a corresponding first electrode from the plurality of first electrodes, and the plurality of light emitting layers separated from each other by the trench; and a second electrode on the plurality of light emitting layers, wherein the trench includes:

a first trench line along a boundary between neighboring column lines of subpixels from the plurality of column lines; and a second trench line along a boundary between neighboring row lines of subpixels from the plurality of row lines, wherein the first trench line includes first side grooves in a column direction, and a first corner groove and a second corner groove that are connected between the first side grooves, the first corner groove and the second corner groove forming a first isosceles portion of the first trench line that protrudes in a row direction, the first corner groove extending in a second diagonal direction and the second corner groove extending in a first diagonal direction, and the first corner groove and the second corner groove connected to each other at a first contact point, wherein the second trench line includes second side grooves in the row direction, and the first corner groove and another second corner groove are connected between the second side grooves, the first corner groove and the another second corner groove forming a second isosceles portion that protrudes in the column direction, the first corner groove and the another second corner groove connected to each other at a second contact point, wherein the first isosceles portion of the first trench line and the second isosceles portion of the second trench line both include the first corner groove.

13. The light emitting display device of claim 12, wherein a second side groove from the second side grooves is connected to the first contact point, and a first side groove from the first side grooves is connected to the second contact point.

14. The light emitting display device of claim 12, wherein a plurality of isosceles portions in the first trench line protrude in a same row direction, and a plurality of isosceles portions in the second trench line protrude in a same column direction.

15. The light emitting display device of claim 12, wherein a plurality of isosceles portions in the second trench line protrude in different column directions, and a plurality of isosceles portions located in the first trench line protrude in a same row direction.

16. The light emitting display device of claim 12, wherein a plurality of isosceles portions in the first trench line protrude in different row directions, and a plurality of isosceles portions in the second trench line protrude in a same column direction.

17. The light emitting display device of claim 12, wherein the first isosceles portion of the first trench line is a first right-angled isosceles portion, and the second isosceles portion of the second trench line is a second right-angled isosceles portion.

18. The light emitting display device of claim 12, further comprising:

a thin film transistor located at a corner portion of the subpixel that is surrounded by the first isosceles portion of the first trench line and the second isosceles portion of the second trench line; and at least one insulating layer between the thin film transistor and a first electrode from the plurality of first electrodes; and a contact hole in the at least one insulating layer, the first electrode and the thin film transistor connected through the contact hole at the corner portion of the subpixel.

19. The light emitting display device of claim 18, wherein the trench extends through the at least one insulating layer.

20. The light emitting display device of claim 19, wherein the at least one insulating layer includes a first insulating layer, a second insulating layer on the first insulating layer, and a third insulating layer on the second insulating layer, and the plurality of subpixels include a red subpixel, a green subpixel, and a blue subpixel, the light emitting display device further comprising:

a first reflector in the red subpixel and between the first insulating layer and the second insulating layer;

a second reflector in the green subpixel and between the second insulating layer and the third insulating layer, and a third reflector in the blue subpixel and between the third insulating layer and the first electrode.

21. A light emitting display device, comprising:

a substrate;

a plurality of subpixels arranged in a plurality of row lines and a plurality of column lines, each subpixel including a first area having a plurality of chamfered corners and a second area having a protrusion that extends from the first area in a first diagonal direction away from the first area in a plan view of the light emitting display device;

a plurality of light emitting elements, each light emitting element in the first area of a corresponding subpixel of the plurality of subpixels;

a plurality of transistors, each transistor in the second area of a corresponding subpixel of the plurality of subpixels and electrically connected to the light emitting element in the first area of the corresponding subpixel; and a trench between the plurality of subpixels and surrounding a perimeter of each of the plurality of subpixels.

22. The light emitting display device of claim 21, wherein the plurality of subpixels includes:

a first subpixel having a first anode electrode, a first light emitting layer on the first anode electrode, and a cathode electrode on the first light emitting layer; and a second subpixel having a second anode electrode, a second light emitting layer on the second anode electrode, and the cathode electrode on the second light emitting layer, wherein a portion of the first light emitting layer and a portion of the second light emitting layer are in the trench and are disconnected from each other in the trench.

23. The light emitting display device of claim 22, further comprising:

at least one insulating layer between the substrate and first anode electrode;

a contact hole through the at least one insulating layer in the second area of the first subpixel, wherein the first anode electrode is electrically connected to the transistor in the second area of the first subpixel through the contact hole.

24. The light emitting display device of claim 22, wherein the trench comprises a trench line along a boundary between the first subpixel and the second subpixel, the trench line including:

a first side groove along a column direction in the plan view, the first side groove between the first subpixel and the second subpixel;

a first corner groove extending along the first diagonal direction in the plan view, the first corner groove having a first end that is connected to an end of the first side groove and a second end; and a second corner groove extending along a second diagonal direction that is different from the first diagonal direction in the plan view, the second corner groove having a first end that is connected to the second end of the first corner groove and a second end.

25. The light emitting display device of claim 24, wherein plurality of subpixels further comprise a third subpixel that is in a same column line from the plurality of column lines as the second subpixel and adjacent to the second subpixel and a fourth subpixel that is in a same column line from the plurality of column lines as the first subpixel and adjacent to the first subpixel, and the trench further comprises a second trench line along a boundary between the first subpixel and the fourth subpixel, the second trench line including:

a second side groove along a row direction in the plan view and between the first subpixel and the fourth subpixel, the second side groove having a first end and a second end; and a third corner groove ending along the first diagonal direction and having a first end that is connected to the second end of the second corner groove and a second end that is connected to the second end of the second side groove in the plan view.

26. The light emitting display device of claim 21, wherein the plurality of subpixels include:

a first subpixel in a first row line from the plurality of row lines and in a first column line from the plurality of column lines;

a second subpixel in the first row line and in a second column line from the plurality of column lines;

a third subpixel in a second row line from the plurality of row lines and in the second column line; and a fourth subpixel in the second row line and in the first column line, wherein the second subpixel, the third subpixel, and the fourth subpixel surround the second area of the first subpixel in the plan view.

* * * * *